United States Patent [19]
Martin

[11] Patent Number: 5,519,339
[45] Date of Patent: May 21, 1996

[54] COMPLEMENTARY SIGNAL BICMOS LINE DRIVER WITH LOW SKEW

[75] Inventor: Brian C. Martin, Los Alamos, N.M.

[73] Assignee: North American Philips Corporation, New York, N.Y.

[21] Appl. No.: 382,952

[22] Filed: Feb. 1, 1995

Related U.S. Application Data

[63] Continuation of Ser. No. 49,742, Apr. 19, 1993, abandoned.

[51] Int. Cl.[6] .............................. H03K 19/0948
[52] U.S. Cl. .............................. 326/84; 326/85
[58] Field of Search .................... 307/443, 446, 307/475, 570; 326/84, 85, 110; 327/108

[56] References Cited

U.S. PATENT DOCUMENTS

| | | | |
|---|---|---|---|
| 4,103,188 | 7/1978 | Morton | 307/446 |
| 4,937,480 | 6/1990 | Higuchi et al. | 307/446 |
| 5,059,821 | 10/1991 | Murabayashi et al. | 307/446 |
| 5,095,229 | 3/1992 | Yun et al. | 307/446 |
| 5,254,885 | 10/1993 | Ando | 307/446 |
| 5,254,887 | 10/1993 | Oguri | 307/446 |

FOREIGN PATENT DOCUMENTS 0239762  10/1987  European Pat. Off. .

*Primary Examiner*—Edward P. Westin
*Assistant Examiner*—Benjamin D. Driscoll
*Attorney, Agent, or Firm*—Steven R. Biren

[57] ABSTRACT

A BiCMOS line driver that incorporates a fully-powered, zero-static power pull-down driver with a standard BiCMOS pullup in a novel parallel input signal path construction having substantially equal propagation delays to create a complementary signal driver with very high speed and extremely low skew in propagation.

16 Claims, 3 Drawing Sheets

COMPLEMENTARY SIGNAL BICMOS LINE DRIVER WITH LOW SKEW

This is a continuation of application Ser. No. 08/049,742, filed Apr. 19, 1993 now abandoned.

RELATED APPLICATION

A commonly-owned, copending application, of which I am a joint inventor, entitled "BiCMOS Output Driver Circuit"

This invention relates to integrated circuits (ICs), and in particular to combined bipolar and complementary MOS (CMOS) circuits, commonly known as BiCMOS circuits.

BACKGROUND OF THE INVENTION

A major problem in CMOS/BiCMOS IC design is how to drive a large capacitive load (such as a gate array) from a driver with low input capacitance—i.e., how to make big signals from small ones. Furthermore, it is often convenient to have complementary signal outputs with very low skew in propagation, meaning that the propagation delay for both outputs are substantially the same. This is important in such applications as, for example, generating both clock phases for latches and flip-flops.

The standard CMOS and BiCMOS solution of staging inverters is unsatisfactory due to the propagation delay through each stage and the inherent skew between complementary signals.

SUMMARY OF THE INVENTION

An object of the invention is an improved BiCMOS circuit.

A further object of the invention is a BiCMOS line driver circuit with low input capacitance yet capable of driving large capacitive loads.

Still another object of the invention is a BiCMOS circuit with very low skew in propagation.

According to one aspect of the invention, a BiCMOS line driver circuit comprises a novel parallel arrangement for complementary signal flow that provides small propagation delay and low skew.

In a preferred embodiment, each of the parallel signal paths includes input circuits whose MOS devices are sized to reduce skew.

According to another aspect of the invention, a BiCMOS line driver circuit comprises parallel input signal paths for complementary signals to minimize skew together with a BiCMOS pull-up circuit for high gain. In a preferred embodiment, the circuit also comprises the fully-powered, zero-static power pull-down driver circuit described in the referenced related application to provide very high gain for driving large loads. This has the further advantage that the large gain tends to make the skew between the complementary signals relatively independent of their respective loads.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

DETAILED DESCRIPTION OF THE PREFERRED EMBODIMENTS

Figure 1:
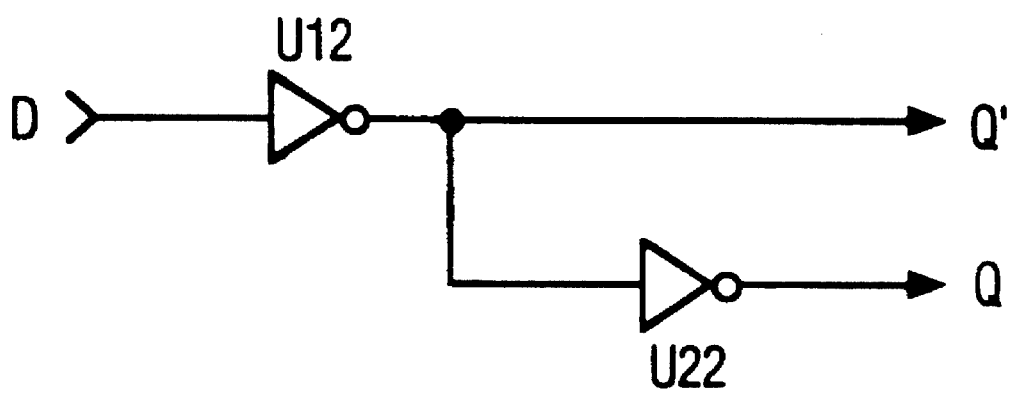
FIG. 1 is a block diagram of a conventional driver circuit providing complementary outputs.
Figure 2:
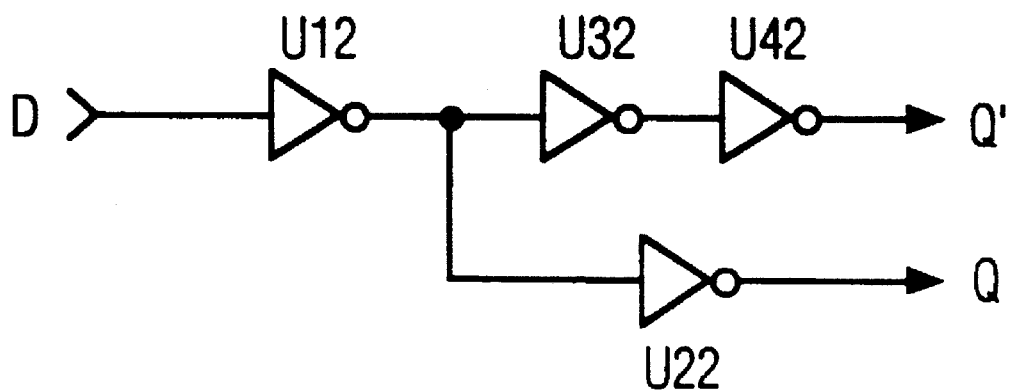
FIG. 2 is a block diagram of a another conventional driver circuit providing complementary outputs.

FIG. 1 shows the most obvious method of getting complementary signals in a line driver circuit. The circuit comprises a common input signal D driving an inverter U12, one output of which drives a second inverter U22, whos output is the signal Q, whereas the other output of the inverter U12 is its complement Q'. Regardless of whether U12 and U22 are CMOS or BiCMOS, signal Q trails signal Q' by a propagation delay—U22 simply can't switch until U12 manages to switch its entire load. The circuit in FIG. 2 attempts to eliminate the effects of the load on the Q' signal, but at the expense of slowing it down by the addition of two extra propagation delays through U32 and U42. Although the skew between Q and Q' in FIG. 2 may be somewhat less, it probably still exists (depending on the loading of Q and Q'), and the total propagation delay of the circuit is greater.

The BiCMOS line driver circuit according to a preferred embodiment of the invention incorporates a fully-powered, zero- static power pull-down driver with a standard BiCMOS pullup in a novel parallel construction to create a complementary signal driver with very high speed and extremely low skew.

Reference is made to the fully-powered, zero-static power pull-down driver described in the referenced related application Ser. No. 08/308,470, which is hereby incorporated by reference. In that circuit, means are provided for channeling current from a DC power source to the base electrode of a bipolar transistor, which can therefore pull the output all the way down to a bipolar $V_{SAT}$ above a reference value, typically ground. In addition, feedback means are provided from the output to turn-off the pull-down circuit after a full high-to-low transmission at the output in order to achieve zero-static power. A preferred embodiment employs a Darlington structure in the pull-down circuit for rapid turn-on and to ensure that the output is pulled all the way down to a $V_{SAT}$. In a preferred embodiment, bipolar means are provided for pulling down the output to a value close to a reference value, with further means being provided to turn-off the bipolar means unless the output rises back above a certain value. Certain aspects of the invention described in the related case employ feedback from the output to control the pull-down circuit. In accordance with a first aspect, the circuit operates to pull-down the output hard, and then turns off to hold the output voltage low with minimum power.

Figure 3:
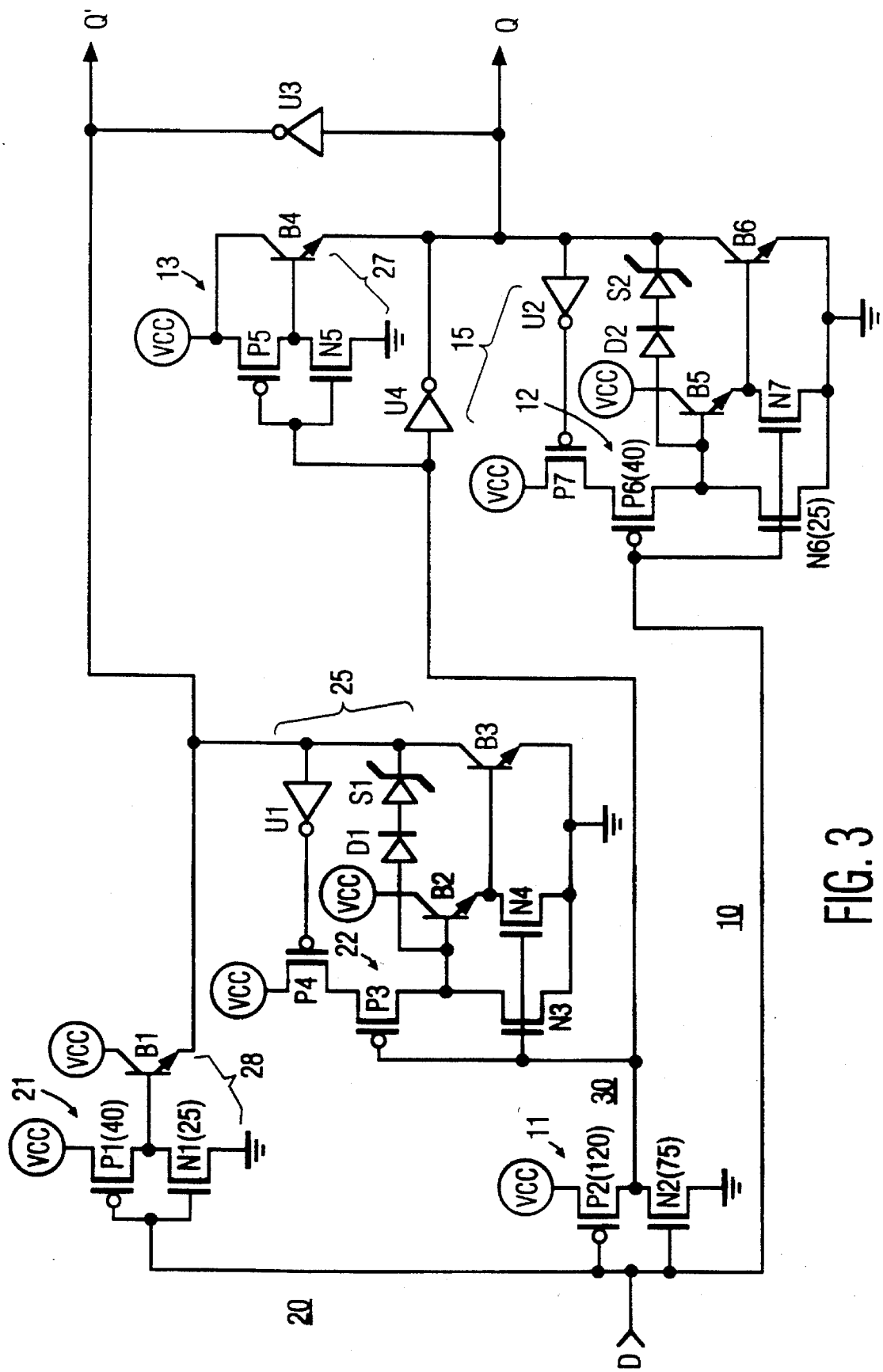
FIGS. 3 and 4 are circuit schematics of several forms of line driver circuits according to the invention.

The circuit illustrated in FIG. 3, as one embodiment according to the invention, comprises the following parts: a first input signal path 10 from a common input D leading to an output Q; a second input signal path 20 from the common input D leading to a complementary output Q'; a third input signal path 30 leading from the common input D. As will be explained in more detail later, the direct signal path 10 controls the pull-down for output Q; the direct signal path 20 controls the pull-up for output Q'; and the inverted signal path 30 controls the pull-down for output Q and the pull-up for output Q'. In this circuit and the one following, the following notation is used. Crossing lines do not form connections at their crossing, except where a line passes through the gate of a MOSFET or the base of a bipolar device. PMOS transistors are designated by a circle at the gate and the half-arrow gate symbol facing downward; NMOS transistors are denoted by the upward facing half arrow gate symbol. Typical CMOS inverters are shown at 11, 21, 12, 13, and 22. It is assumed that a value close to Vcc is a logic-high signal and and a value close to ground (Grd) is a logic-low signal. In a typical application, with the input high, the Q and Q' outputs would be connected to separate lines, held normally at a logic-high and logic-low level, respectively. When the input signal D goes low, the Q output should be pulled low and the Q' output pulled high. When the input signal D goes high, the Q output should be pulled high and the Q' output pulled low.

The circuits designated 15 and 25 are each representative of a fully-powered, zero-static power pull-down driver as described in the related case, with PMOS P7/P4 providing the channelled current from Vcc under control of the inverter U2/U1 which provides the feedback to turn off P7/P4 when the output Q/Q' has fallen down close to Grd. B5, B6, and B2, B3 provide the high-gain Darlington circuits for rapid pull-down. PN junction diodes D2/D1 and Schottky diodes S2/S1 help keep transistors B5/B2 and B6/B3 from saturating by draining the bases of B5/B2 when the output voltage falls below 0.2 volts thereby disabling the base drive of transistors B6/B3. The circuits designated 27 and 28 provide standard BiCMOS pull-up circuitry for, respectively, the outputs Q and Q'.

In operation, the input signal D is transmitted down three parallel input signal paths 10, 20 and 30. P1 and N1 control the BiCMOS pull-up for Q', and P6 and N6 control the pull-down for Q. P2 and N2 invert the input signal and apply it to the BiCMOS pull-up 27 for Q and the pull-down 25 for Q'. U3 and U4 form small CMOS "keepers" to hold Q and Q' all the way to Vcc or Gnd.

When receiving the signal D directly from an input, the sizing ratios (width-to-length of a MOS channel) of P1 to N1 and P2 to N2 and P6 to N6 must all be equal in order to guarantee a single common threshold or switching voltage at the input. As an example only, which is not to be considered limiting, next to certain of the components in FIG. 3 are numbers in parentheses indicating the MOS width-to-length ratio as an example of suitable sizing ratios. Those skilled in the art will recognize that other sizing ratios within the principles taught herein will also be capable of achieving the benefits described.

There are several advantages to this architecture. First, the parallel input construction allows the designer to designate "slow" and "fast" paths by properly sizing the three input inverters 11, 12 and 21, without having to modify optimum designs for the other components, the goal being that the overall propagation delay in each of the three signal paths is approximately the same. For low skew, the center path 30 would need to be "fast" to overcome the extra propagation delay; therefore, the P2/N2 inverter would be much larger than the P1/N1 and P6/N6 inverters, typically about 2 or more times larger. An example of suitable sizing ratios would be the following: P1/N1=P2/N2=P6/N6=⅗, for a mid-range input threshold, and the ratios of P1/P2=P6/P2= about ⅓ for low skew. But it will be understood that the circuit of the invention is not limited to having a common input threshold for all three input signal paths. Second, the complementary signals are both generated with a minimum number of propagation delays. Third, the use of the BiC-MOS pull-up 27,28 and especially the fully-powered, zero-static power pull-down driver 15,25 create extremely high gain for driving large loads. Further, the large gain tends to make the skew between the Q and the Q' signals relatively independent of their respective loads.

Figure 4:
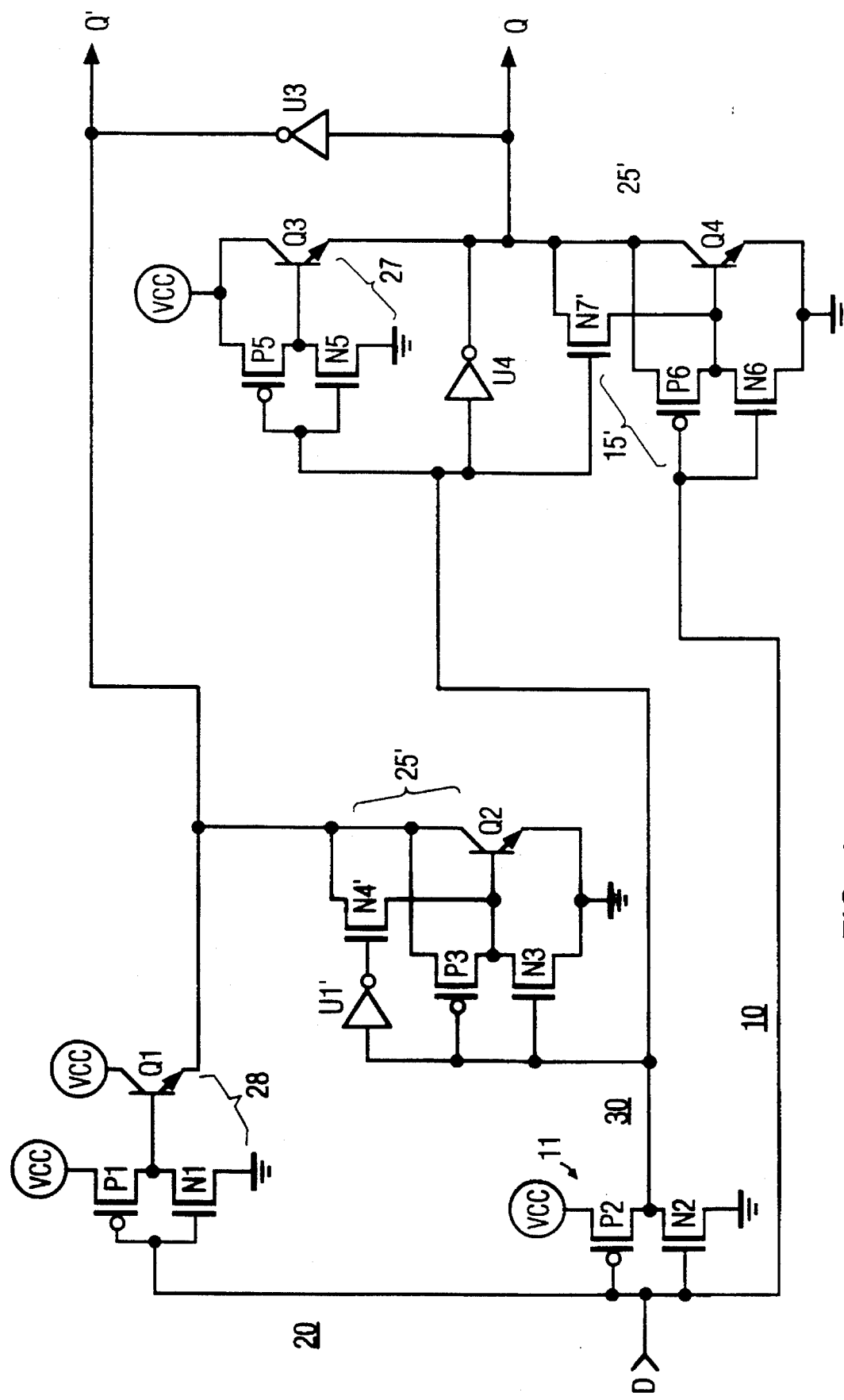

FIG. 4 shows a variant of the FIG. 3 circuit. Elements designated by the same reference numerals function similarly. As before, three parallel input signal paths 10, 20, 30 are created. Path 10 includes a pull-down circuit 15' for the Q output; path 20 includes a pull-up circuit 28 for the Q' output; path 30 includes a pull-up circuit 27 for the Q output and a pull-down circuit 25' for the Q' output. One can still achieve excellent low-skew characteristics from this variant, but the gain is not quite as high, as BiCMOS pull-down circuits 15' and 25' are used instead of their high-gain counterparts in the FIG. 3 circuit.

The pull-down circuit 15' operates as follows. When the D input goes low, the PMOS P6 turns on quickly for good speed, but its drive turns off rapidly as the ouput makes the high-low transition because of the decreasing $V_{gs}$, and therefore won't guarantee pull-down below 1 volt. The NMOS N7' turns on after a propagation delay through P2/P4 but provides an active pull-down all the way down to 0.7 volts. The circuit 25' operates similarly with inverter U1' added to provide the correct polarity.

It should be noted that here, as in FIG. 3 also, instead of simple inverters 11, 12 or 21 from the input, additional CMOS logic, e.g., NANDs or NORs, could be added to perform additional functions, and the input logic appropriately sized to take into account the additional propagation delay.

The circuit of the invention is useful for driving other on-chip circuits, as well as as an output driver for, for example, busses.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. In a zero-static-power BiCMOS driver circuit having dissimilar first and second parallel input signal paths each having a CMOS input device and a bipolar output device for providing first and second complementary outputs to an external circuit and operated from a single DC supply voltage source, each bipolar output device having a control electrode, the improvement comprising:

(a) means in said signal paths for providing low skew between the complementary outputs, said low skew providing means comprising:
(i) means in the first and second signal paths comprising field effect transistors for controlling the propagation delay for signals in said paths so that the overall propagation delays of the paths substantially match, said propagation delays being at least substantially determined by width-to-length sizing ratios of said field effect transistors; and b) means connected to each output for turning off the corresponding bipolar device after a substantially full high-to-low transition at the corresponding output.

2. The BiCMOS driver circuit as claimed in claim 1, wherein each signal path comprises one or more inverters, said inverters being sized to provide a propagation delay in their respective signal path such that the overall propagation delay in both signal paths are substantially the same.

3. The BiCMOS driver circuit as claimed in claim 2, further comprising means for channeling sufficient current from the single DC supply voltage source to the bipolar control electrodes so as to cause each bipolar output device to pull down their corresponding outputs substantially to a bipolar $V_{SAT}$ voltage drop above a reference value.

4. A driver circuit as claimed in claim 3, further comprising BiCMOS means connected to each of the outputs for pulling-up each of the outputs.

5. A driver circuit as claimed in claim 1, further comprising means connected to each output for turning off the corresponding bipolar device after a substantially full high-to-low transition at the corresponding output in such manner so as to provide a zero static power characteristic.

6. A driver circuit as claimed in claim 1, wherein said first signal path includes a BiCMOS pull-down circuit coupled to the first output and said second signal path includes a BiCMOS pull-up circuit coupled to the second output and further including a third signal path having a BiCMOS pull-up circuit coupled to the first output and a BiCMOS pull-down circuit coupled to the second output.

7. A driver circuit as claimed in claim 6, wherein the pull-up circuit in the third signal path includes a CMOS input device connected to a bipolar transistor having a base and an emitter connected to the first output and wherein said CMOS input device includes an NMOS device having a gate connected to the third signal path and a main electrode connected to the base of the bipolar transistors.

8. A line driver circuit comprising first and second parallel input signal paths each having a CMOS input device and a bipolar output device for providing first and second complementary outputs to an external circuit and operating from a first DC supply voltage source and a second DC supply voltage source, the first DC supply voltage source and the second DC supply voltage source operating to form a single DC supply voltage source difference to operate the circuit, each said CMOS input device comprising serial-connected PMOS and NMOS devices each having main source and drain and gate electrodes, said CMOS gate electrodes being connected to a common circuit input, each said bipolar output device comprising a bipolar transistor device having emitter, collector and base electrodes, said base electrode being connected to one of the CMOS main source and drain electrodes and said collector electrode being connected as one of the complementary outputs, further comprising:

(a) means for inputting a logic-low signal to cause a high-to-low transition at the first output, (b) means for channeling current from the first DC supply voltage source into the bipolar transistor base in the first and second signal paths so as to pull down their respective outputs substantially to a bipolar $V_{SAT}$ voltage drop above a reference value, (c) means connected to the first and second outputs for pulling-up their respective output, (d) said first and second signal paths being configured such that their respective propagation delays for signals are approximately the same.

9. A driver circuit as claimed in claim 8, wherein said first signal path includes a BiCMOS pull-down circuit coupled to the first output and said second signal path includes a BiCMOS pull-up circuit coupled to the second output and further including a third signal path having a BiCMOS pull-up circuit coupled to the first output and a BiCMOS pull-down circuit coupled to the second output.

10. A driver circuit as claimed in claim 9, wherein said channeling means comprises a MOS device having source and drain and gate electrodes, the source and drain electrodes being connected in series with the CMOS input device and the first DC supply voltage source, and means connecting the first output to the gate electrode of said MOS device for shutting-off the MOS device after a full high-to-low transition.

11. A line driver circuit as claimed in claim 10, wherein the means connecting the first output to the gate electrode comprises an inverter, and said MOS device is PMOS.

12. A line driver circuit as claimed in claim 11, wherein one of said bipolar output devices includes a further bipolar transistor device having emitter, collector and base electrodes, said emitter of said further bipolar transistor device coupled to said base of said bipolar transistor device and further including diode means coupled between said collector of said bipolar transistor device and said base of said further bipolar transistor device.

13. The line driver circuit of claim 9, wherein each signal path comprises an input inverter.

14. The line driver circuit of claim 13, wherein the input inverters have different sizing ratios to provide substantially equal propagation delays.

15. The line driver circuit of claim 14, wherein all three inputs of the three signal paths have the same input threshold.

16. The line driver circuit of claim 14, wherein the sizing ratios of the inverters in the first and second signal paths are about the same, and the sizing ratio of the inverter in the third signal path is about 2 or more times greater than that of the inverter in the first signal path.

\* \* \* \* \*